(12) United States Patent
Lin et al.

(10) Patent No.: US 12,513,882 B2
(45) Date of Patent: Dec. 30, 2025

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei (CN)

(72) Inventors: Chao Lin, Hefei (CN); Xiaojie Li, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 434 days.

(21) Appl. No.: 18/178,567

(22) Filed: Mar. 6, 2023

(65) Prior Publication Data

US 2024/0049442 A1  Feb. 8, 2024

Related U.S. Application Data

(63) Continuation of application No. PCT/CN2022/112940, filed on Aug. 17, 2022.

(30) Foreign Application Priority Data

Aug. 4, 2022 (CN) .......................... 202210933200.7

(51) Int. Cl.
 *H10B 12/00* (2023.01)
(52) U.S. Cl.
 CPC ............. *H10B 12/05* (2023.02); *H10B 12/30* (2023.02)
(58) Field of Classification Search
 CPC ................................ H10B 12/05; H10B 12/30
 See application file for complete search history.

(56) References Cited

U.S. PATENT DOCUMENTS

| 9,917,100 B2 | 3/2018 | Zhang |
| 10,038,054 B2 | 7/2018 | Rachmady et al. |

(Continued)

FOREIGN PATENT DOCUMENTS

| CN | 104054181 A | 9/2014 |
| CN | 111223778 A | 6/2020 |

(Continued)

OTHER PUBLICATIONS

International Search Report in the international application No. PCT/CN2023/098689, mailed on Aug. 3, 2023, 3 pages.

(Continued)

*Primary Examiner* — Bitew A Dinke
(74) *Attorney, Agent, or Firm* — Syncoda LLC; Feng Ma (57) ABSTRACT

A method for forming a semiconductor structure includes: a base is provided, the base including a first area and a second area located outside the first area, the first area including stack structures and first isolation structures arranged alternately in a first direction, each stack structure including first semiconductor layers and second semiconductor layers stacked onto one another alternately in a third direction, the first direction being a direction in a plane where the base is located, the third direction intersecting with the plane where the base is located; the first semiconductor layers located in the first area, and the first isolation structures located in the first area and located in projection areas of the first semiconductor layers in the first direction are successively removed, to form active dummy connection layers extending in the first direction; and gate structures are formed on surfaces of the active dummy connection layers.

14 Claims, 7 Drawing Sheets

(56) References Cited

U.S. PATENT DOCUMENTS

| | | |
|---|---|---|
| 11,502,086 B2 | 11/2022 | Son et al. |
| 12,052,854 B2 * | 7/2024 | Okajima ................ H10D 62/80 |
| 2013/0341704 A1 | 12/2013 | Rachmady |
| 2017/0148811 A1 | 5/2017 | Zhang |
| 2017/0154960 A1 | 6/2017 | Rachmady et al. |
| 2019/0103407 A1 * | 4/2019 | Kim ....................... H10B 12/30 |
| 2019/0326288 A1 * | 10/2019 | Hashemi .............. H10D 62/116 |
| 2020/0075599 A1 | 3/2020 | Hashemi et al. |
| 2020/0279601 A1 * | 9/2020 | Kim ..................... G11C 11/4097 |
| 2021/0036146 A1 | 2/2021 | Zhou |
| 2021/0183862 A1 * | 6/2021 | Son ................... H01L 21/28518 |
| 2021/0202479 A1 | 7/2021 | Naskar et al. |
| 2021/0408047 A1 | 12/2021 | Wang et al. |
| 2022/0093626 A1 * | 3/2022 | Shin ........................ G11C 5/06 |
| 2022/0102358 A1 * | 3/2022 | Park ...................... H10B 12/03 |
| 2022/0157819 A1 * | 5/2022 | Jung ..................... H10B 12/05 |
| 2022/0209003 A1 | 6/2022 | Zhou |
| 2022/0416049 A1 * | 12/2022 | Shao ................. H10D 30/6757 |
| 2023/0014052 A1 * | 1/2023 | Tang .................. H10B 12/482 |
| 2023/0014263 A1 * | 1/2023 | Huang ............... H10D 30/6757 |
| 2023/0015279 A1 * | 1/2023 | Shao .................... H10B 12/033 |
| 2023/0017086 A1 * | 1/2023 | Li ......................... H10B 12/03 |
| 2023/0261075 A1 * | 8/2023 | Gardner ............ H10D 30/6757 |
| | | 257/288 |
| 2024/0047558 A1 * | 2/2024 | Lin ..................... H10D 30/014 |

FOREIGN PATENT DOCUMENTS

| | | | | |
|---|---|---|---|---|
| CN | 111435643 A | | 7/2020 | |
| CN | 111627885 A | | 9/2020 | |
| CN | 112309860 A | | 2/2021 | |
| CN | 112992902 A | | 6/2021 | |
| CN | 113437079 A | | 9/2021 | |
| CN | 113497036 A | | 10/2021 | |
| CN | 114121819 A | * | 3/2022 | ............. G11C 5/063 |
| CN | 114121820 A | * | 3/2022 | ........... H10D 64/017 |
| CN | 114141712 A | | 3/2022 | |
| CN | 114420644 A | | 4/2022 | |
| CN | 115295551 A | | 11/2022 | |

OTHER PUBLICATIONS

International Search Report in the international application No. PCT/CN2022/113254, mailed on Dec. 22, 2022, 8 pages.

International Search Report in the international application No. PCT/CN2022/112940, mailed on Dec. 20, 2022, 8 pages.

US office action in U.S. Appl. No. 18/150,850, mailed on May 13, 2025.

* cited by examiner

SEMICONDUCTOR STRUCTURE AND METHOD FOR FORMING SEMICONDUCTOR STRUCTURE

CROSS-REFERENCE TO RELATED APPLICATIONS

This application is a continuation application of International Patent Application No. PCT/CN2022/112940, filed on Aug. 17, 2022, which claims priority to Chinese Patent Application No. 202210933200.7, filed on Aug. 4, 2022 and entitled "SEMICONDUCTOR STRUCTURE AND METHOD FOR FORMING SEMICONDUCTOR STRUCTURE". The disclosures of International Patent Application No. PCT/CN2022/112940 and Chinese Patent Application No. 202210933200.7 are hereby incorporated by reference in their entireties.

BACKGROUND

A Three Dimensions Dynamic Random Access Memory (3D DRAM) can extend in a vertical direction, which is the development direction of a DRAM technology in the future. In a related art, the gate structure of the 3D DRAM can be selected from a Gate All Around (GAA) structure or a dual gate structure. The gate structures of two adjacent transistors of multiple transistors located in the same layer are isolated from each other by an electron barrier layer, for example, by air or a dielectric, and the gate structures of two adjacent transistors of the multiple transistors located in the same layer need to be led out by the same gate metal layer (i.e., word line). However, in the 3D DRAM in the related art, a gate metal layer for connecting the gate structures of the two adjacent transistors of the multiple transistors located in the same layer with each other and the gate structure of each transistor located in the same layer cannot be formed simultaneously, so that a preparation process is complex.

SUMMARY

The disclosure relates to the technical field of semiconductors, and relates, but is not limited, to a semiconductor structure and a method for forming a semiconductor structure.

In view of this, embodiments of the disclosure provide a semiconductor structure and a method for forming a semiconductor structure.

In a first aspect, the embodiments of the disclosure provide a method for forming a semiconductor structure. The method includes the following operations.

A base is provided. The base includes a first area and a second area located outside the first area. The first area includes stack structures and first isolation structures, and the stack structures and the first isolation structures are arranged alternately in a first direction. Each of the stack structures includes first semiconductor layers and second semiconductor layers, and the first semiconductor layers and the second semiconductor layers are stacked onto one another alternately in a third direction. The first direction is a direction in a plane where the base is located. The third direction intersects with the plane where the base is located.

The first semiconductor layers located in the first area and the first isolation structures located in the first area and located in projection areas of the first semiconductor layers in the first direction are removed successively, to form active dummy connection layers extending in the first direction. Gate structures are formed on surfaces of the active dummy connection layers.

In a second aspect, the embodiments of the disclosure provide a semiconductor structure, which at least include: a semiconductor substrate, active dummy connection layers, and gate structures.

The semiconductor substrate includes a first area and a second area located outside the first area.

The active dummy connection layers extend in a first direction. The active dummy connection layers are located in the first area of the semiconductor substrate and are spaced apart from each other in a third direction. The first direction is a direction in a plane where the semiconductor substrate is located, and the third direction intersects with the plane where the semiconductor substrate is located.

The gate structures are located on surfaces of the active dummy connection layers.

BRIEF DESCRIPTION OF THE DRAWINGS

In the drawings (which are not necessarily drawn to scale), similar reference numerals may describe similar parts in different views. Similar reference numerals with different letter suffixes may represent different examples of similar parts. The drawings generally illustrate the various embodiments discussed herein by way of examples rather than limitation.

Reference numerals in the drawings are described as follows.

10-semiconductor substrate; 11-stack structure; 11a-initial stack structure; 111-first semiconductor layer; 112-second semiconductor layer; 12-first isolation structure; 12a-insulating layer; 13-isolation trench; 14-mask layer; 15-etching groove; 16-sacrificial structure; 161-first sacrificial layer; 162-second sacrificial layer; 17-support structure; 18-first opening; 19-active dummy connection layer; 191-active layer; 192-dummy connection layer; 19a-first surface; 19b-second surface; 193-third sacrificial layer; 20-first space; 21-gate structure; 211-gate dielectric layer; 212-gate conductive layer; 22-second isolation structure; 100-semiconductor structure; A-first area; B-second area; and F-sub-preset pattern.

DETAILED DESCRIPTION

Exemplary implementation modes of the disclosure will be described below in more detail with reference to the drawings. Although the exemplary implementation modes of the disclosure are shown in the drawings, it should be understood that the disclosure may be implemented in various forms and should not be limited by the specific implementation modes elaborated herein. On the contrary, these implementation modes are provided to enable a more thorough understanding of the disclosure and to fully convey the scope of the disclosure to those skilled in the art.

In the following description, a large number of specific details are given in order to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described here, and the known functions and structures are not described in detail.

In the drawings, the dimensions of layers, areas, and elements and their relative dimensions may be exaggerated for clarity. Throughout the description, the same reference numerals represent the same elements.

It is to be understood that description that an element or layer is "above", "adjacent to", "connected to", or "coupled to" another element or layer may refer to that the element or layer is directly above, adjacent to, connected to or coupled to the another element or layer, or there may be an intermediate element or layer. On the contrary, description that an element is "directly on", "directly adjacent to", "directly connected to" or "directly coupled to" another element or layer refers to that there is no intermediate element or layer. It is to be understood that although various elements, components, areas, layers, and/or parts may be described with terms first, second, third, etc., these elements, components, areas, layers, and/or parts should not be limited to these terms. These terms are used only to distinguish one element, component, area, layer or part from another element, component, area, layer or part. Therefore, a first element, component, area, layer, or part discussed below may be represented as a second element, component, area, layer, or part without departing from the teaching of the disclosure. However, when the second element, component, area, layer, or part is discussed, it does not mean that the first element, component, area, layer, or part must exist in the disclosure.

The terms used herein are intended only to describe specific embodiments and are not a limitation of the disclosure. As used herein, singular forms "a/an", "one", and "the" may also be intended to include the plural forms, unless otherwise specified types in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, terms "and/or" includes any and all combinations of the related listed items.

Before introducing the embodiments of the disclosure, three directions for describing a three-dimensional structure that may be used in the following embodiments are defined first. Taking a Cartesian coordinate system as an example, the three directions may include an X-axis direction, a Y-axis direction, and a Z-axis direction. The base may include a top surface located on a front side thereof and a bottom surface located on a back side thereof opposite to the front side. The direction intersecting (for example, being perpendicular to) with the top surface and the bottom surface of the base is defined as a third direction in a case of ignoring the flatness of the top surface and the bottom surface. In the direction of the top surface and bottom surface of the base (i.e. the plane where the base is located), two directions that intersect with each other (for example, that are perpendicular to each other) are defined. For example, the extending direction of the support structures may be defined as a first direction, and the arrangement direction of the support structures may be defined as a second direction. The plane where the base is located may be determined according to the first direction and the second direction. In the embodiments of the disclosure, the first direction, the second direction, and the third direction may be perpendicular to one another pairwise. In other embodiments, the first direction, the second direction, and the third direction may also be not perpendicular to one another pairwise. In the embodiments of the disclosure, the first direction is defined as an X-axis direction, the second direction is defined as the Y-axis direction, and the third direction is defined as the Z-axis direction.

Figure 1:
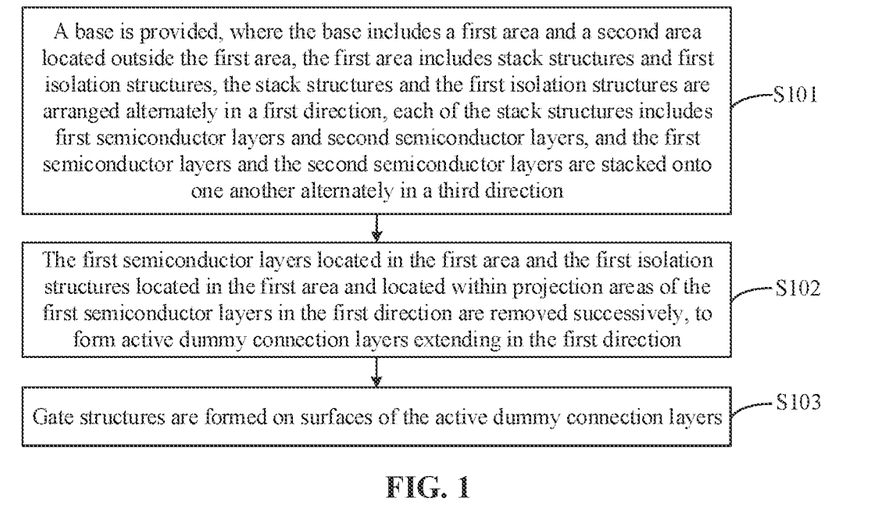
FIG. 1 illustrates a schematic flowchart of a method for forming a semiconductor structure provided by the embodiments of the disclosure.

The embodiments of the disclosure provide a method for forming a semiconductor structure. FIG. 1 illustrates a schematic flowchart of a method for forming a semiconductor structure provided by the embodiments of the disclosure. As shown in FIG. 1, the method for forming the semiconductor structure includes the following operations.

At S101, a base is provided. The base includes a first area and a second area located outside the first area. The first area includes stack structures and first isolation structures, where the stack structures and the first isolation structures are arranged alternately in a first direction. Each of the stack structures includes first semiconductor layers and second semiconductor layers, where the first semiconductor layers and the second semiconductor layers are stacked onto one another alternately in a third direction.

In the embodiments of the disclosure, the base at least includes a semiconductor substrate. The semiconductor substrate may be a silicon substrate. The semiconductor substrate may also include other semiconductor elements such as germanium (Ge), or semiconductor compounds such as silicon carbide (SiC), gallium arsenide (GaAs), gallium phosphide (GaP), indium phosphide (InP), indium arsenide (InAs), or indium antimonide (InSb), or other semiconductor alloys such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP), and/or indium gallium arsenide phosphide (GaInAsP) or a combination thereof.

In the embodiments of the disclosure, the first area and the second area may respectively be arranged to form different functional structures. For example, the first area may be arranged to form gate structures. The second area may be arranged to form other semiconductor structures such as a word line structure, a capacitor structure, or a bit line structure.

In the embodiments of the disclosure, the stack structure includes the first semiconductor layers and the second semiconductor layers stacked alternately in the third direction from bottom to top. The material of the first semiconductor layer may be Ge, SiGe, or SiC, or may also be a Silicon-On-Insulator (SOI) or a Germanium-on-Insulator (GOI). The second semiconductor layer may be a silicon layer, or may also include other semiconductor elements such as Ge, or include semiconductor compounds such as SiC, GaAs, GaP, InP, InAs, or InSb, or include other semiconductor alloys such as SiGe, GaAsP, AlInAs, AlGaAs, GaInAs, GaInP, and/or GaInAsP or a combination thereof.

In the embodiments of the disclosure, the material of the first semiconductor layers is different from the material of the second semiconductor layers, because the first semiconductor layers need to be removed and the second semiconductor layers need to be retained subsequently. Therefore, the first semiconductor layers have greater etching selectivity ratio relative to the second semiconductor layers. For example, the etching selectivity ratio of the first semiconductor layers to the second semiconductor layers may range from 5 to 15, so that the first semiconductor layers are etched and removed more easily relative to the second semiconductor layers during etching.

In the embodiments of the disclosure, the material for the first isolation structures may be any insulating material such as silicon oxide or silicon oxynitride.

At S102, the first semiconductor layers located in the first area and the first isolation structures located in the first area and located in projection areas of the first semiconductor layers in the first direction are removed successively, to form active dummy connection layers extending in the first direction.

In the embodiments of the disclosure, the first semiconductor layers located in the first area may be etched and removed by a wet etching process (for example, etching by using strong acids such as concentrated sulfuric acid, hydrofluoric acid, and concentrated nitric acid) or a dry etching process (such as a plasma etching process, a reactive ion etching process, or an ion milling process). The first isolation structures in located in the first area and located in projection areas of the first semiconductor layers in the first direction may be removed by a lateral etching technology.

In the embodiments of the disclosure, each of the active dummy connection layers includes active layers and dummy connection layers, where the active layers and the dummy connection layers are arranged alternately in the first direction. The active layers and the dummy connection layers are formed by the following operations. After the first semiconductor layers located in the first area and the first isolation structures located in the first area and located in projection areas of the first semiconductor layers in the first direction are removed successively, the remaining parts of the second semiconductor layers form the active layers, and the remaining parts of the first isolation structures form the dummy connection layers.

In the embodiments of the disclosure, on one hand, the dummy connection layers can achieve the connection between two of the active layers arranged in the first direction, and facilitate subsequent formation of a gate metal layer for connecting the gate structures in the same layer with each other; and on the other hand, the dummy connection layers can serve as electron barrier layers to isolate any two gate structures, which are adjacent to each other in the first direction, from one another, which reduces leakage current, thereby improving the yield of the prepared semiconductor structures.

It is to be noted that in the embodiments of the disclosure, at least the first isolation structures located in the first area and located in projection areas of the first semiconductor layers in the first direction are removed. In other embodiments, part of the first isolation structures located in the first area and located in projection areas of the second semiconductor layers in the first direction may also be removed to form convex-concave active dummy connection layers. Each of the convex-concave active dummy connection layers includes convex active layers and concave dummy connection layers, where the convex active layers and the concave dummy connection layers are arranged alternately in the first direction. The dimension of each of the convex active layers in the third direction is greater than the dimension of each of the concave dummy connection layers in the third direction.

In some embodiments, the active dummy connection layers may also be thinned to increase a void between any active dummy connection layers adjacent to each other in the third direction, to facilitate subsequent formation of the gate structures on the surfaces of the active dummy connection layers.

In some embodiments, the active dummy connection layers may be thinned after the active dummy connection layers are formed; or after the first semiconductor layers located in the first area are removed, the remaining parts of the second semiconductor layers are thinned to form thinned active layers, and then the first semiconductor layers located in the first area and the first isolation structures located in the projection areas of the thinned second semiconductor layers in the first direction may be removed simultaneously to form thinned dummy connection layers, to obtain active dummy connection layers including the thinned active layers and the thinned dummy connection layers.

At S103, gate structures are formed on surfaces of the active dummy connection layers.

In the embodiments of the disclosure, each of the gate structures includes a gate dielectric layer and a gate conductive layer located on a surface of the gate dielectric layer.

In the embodiments of the disclosure, the material of the gate dielectric layer may be silicon oxide or other suitable materials. The material of the gate conductive layer may be any one of the materials with good electrical conductivity, such as titanium (Ti), titanium nitride (TiN), tungsten nitride (WN), tungsten (W), cobalt (Co), platinum (Pt), palladium (Pd), ruthenium (Ru), and Copper (Cu).

In the embodiments of the disclosure, the gate dielectric layer and the gate conductive layer may be formed through any suitable deposition process, such as a Chemical Vapor Deposition (CVD) process, a Physical Vapor Deposition (PVD) process, an Atomic Layer Deposition (ALD) process, a spin coating process, a coating process and a furnace tube process.

In the embodiments of the disclosure, a stack structure that is formed by stacking a plurality of gate structures onto one another in the third direction may form a three-dimensional semiconductor structure, to improve the integration level of the semiconductor structure and realize miniaturization.

In the embodiments of the disclosure, a dummy connection layer for connecting two active layers in a first direction with each other is formed during forming a semiconductor structure. The dummy connection layer can facilitate subsequent formation of a gate metal layer for connecting gate structures located in the same layer with each other, which simplifies a process of the gate structures, and reduces the preparation cost of the semiconductor structure. In addition, the dummy connection layer can also serve as an electronic barrier layer to isolate adjacent gate structures in the same layer from one another, which reduces leakage current, thereby improving the yield of the prepared semiconductor structures.

Figure 2A:
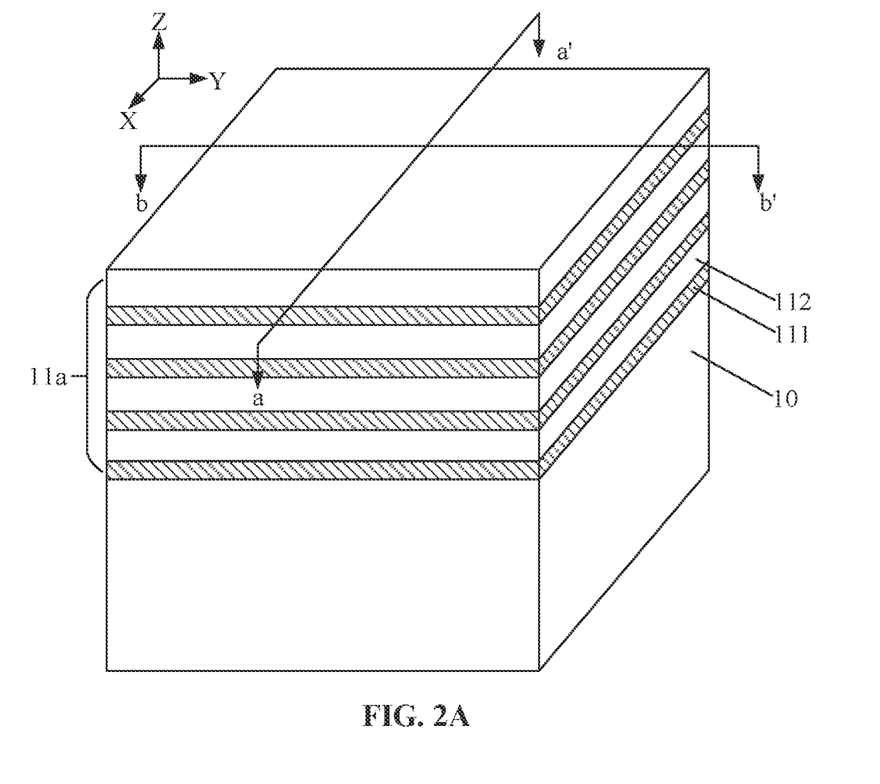
FIG. 2A to FIG. 2P illustrate schematic diagrams of a process for forming a semiconductor structure provided by the embodiments of the disclosure.
Figure 2B:
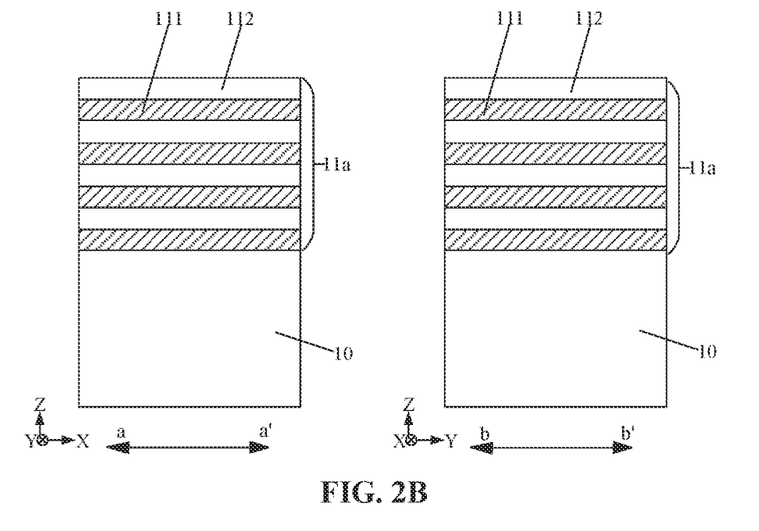
Figure 2C:
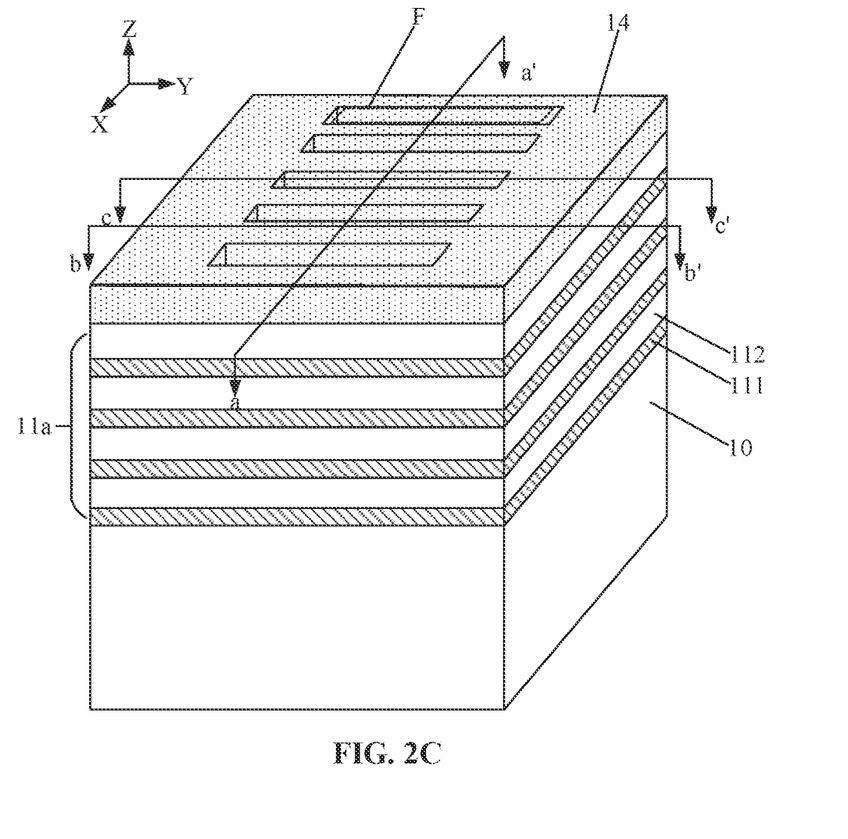
Figure 2D:
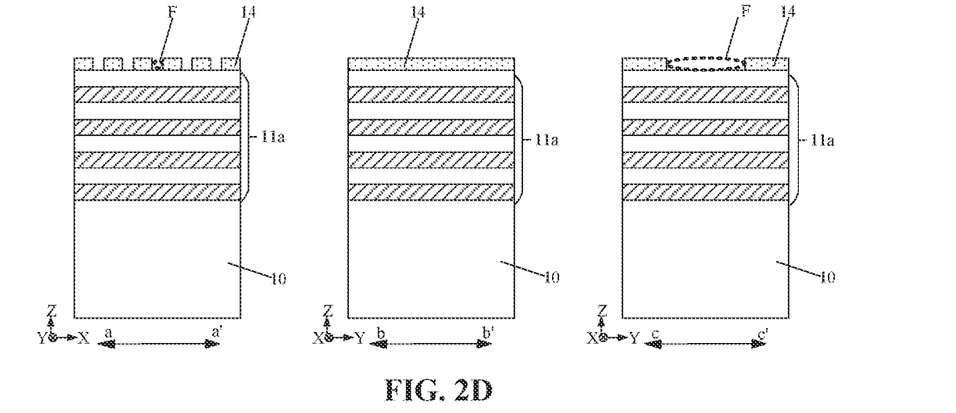
Figure 2E:
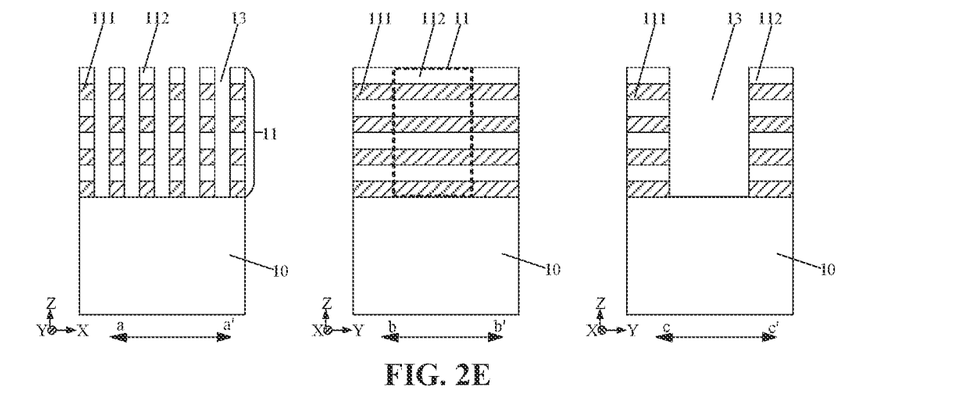
Figure 2F:
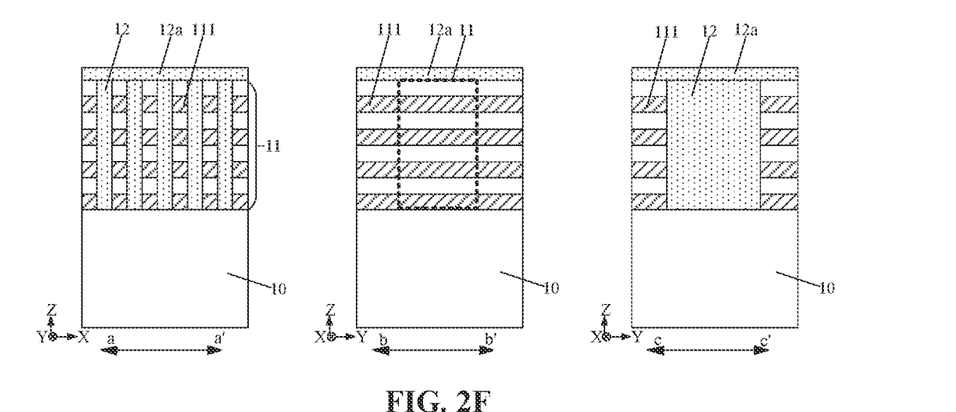
Figure 2G:
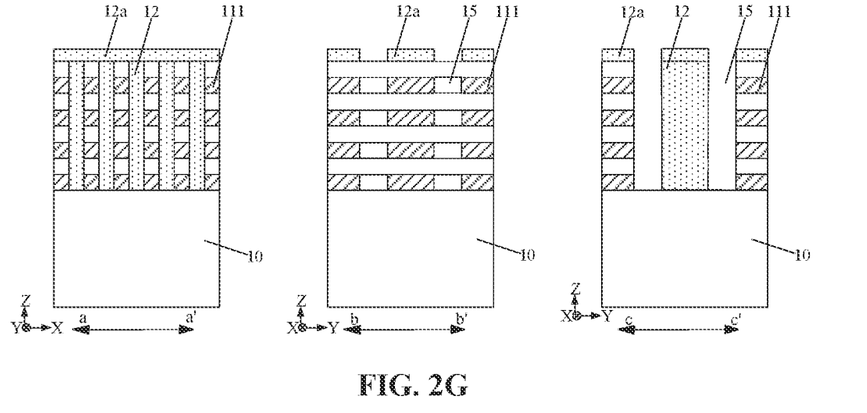
Figure 2H:
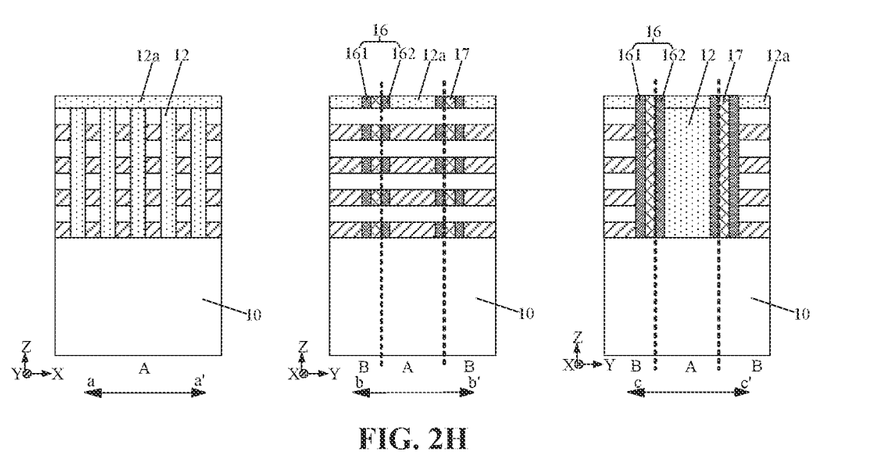
Figure 2I:
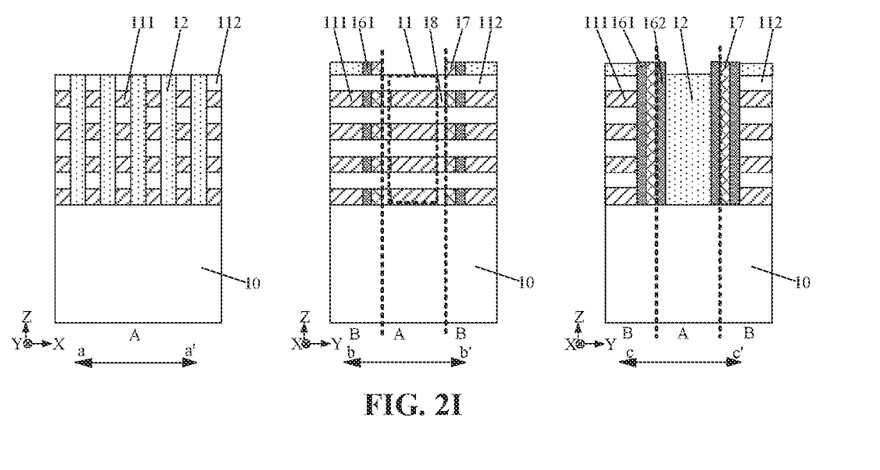
Figure 2J:
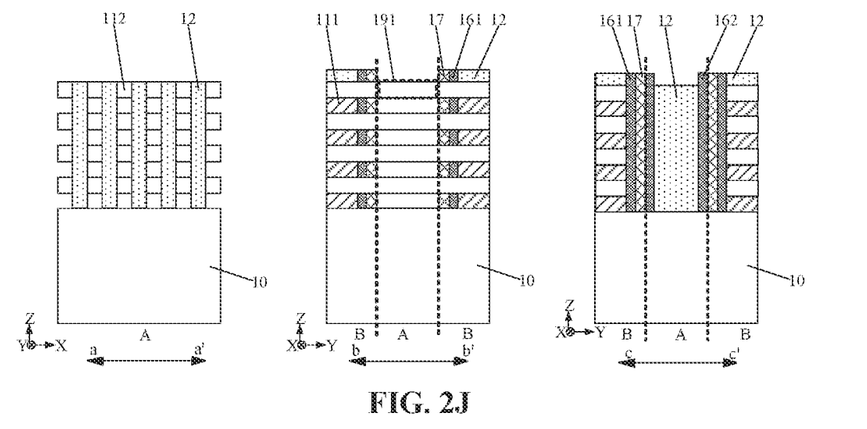
Figure 2K:
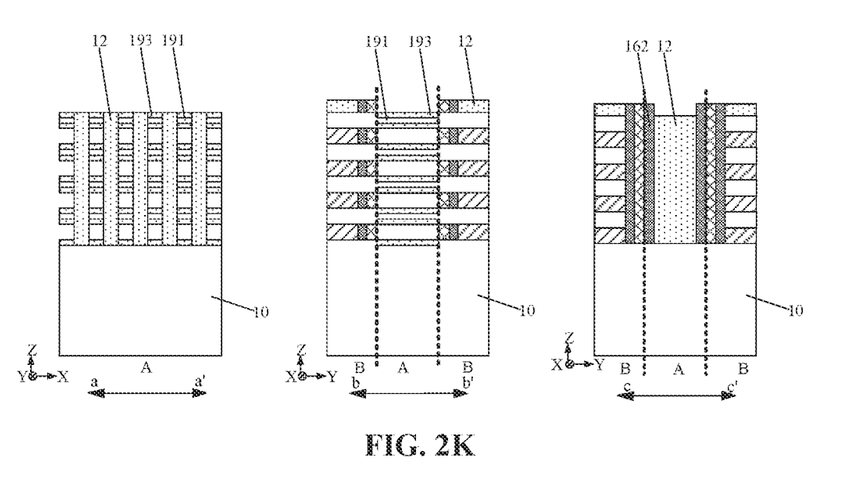
Figure 2L:
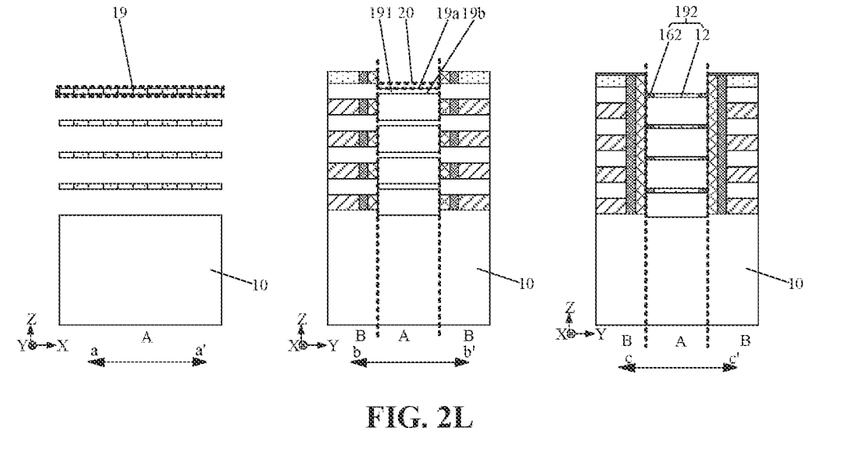
Figure 2M:
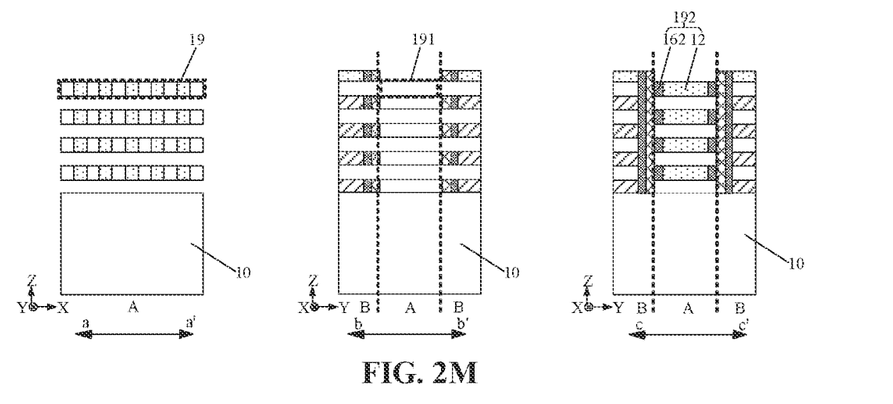
Figure 2N:
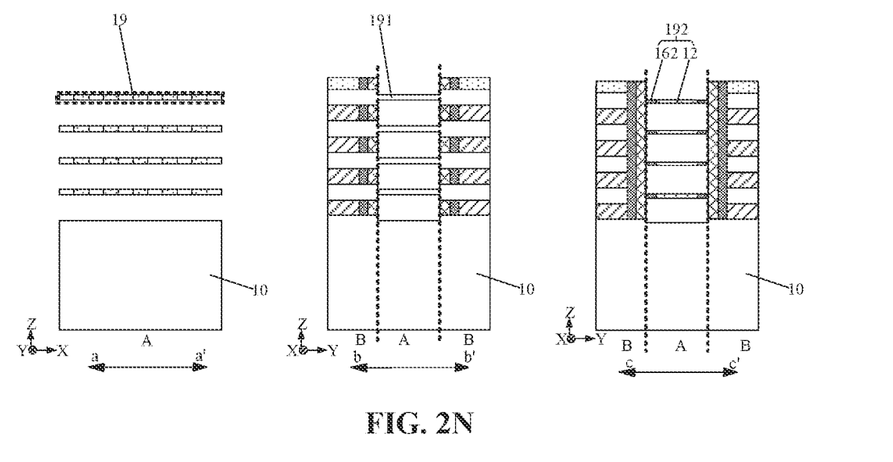
Figure 2O:
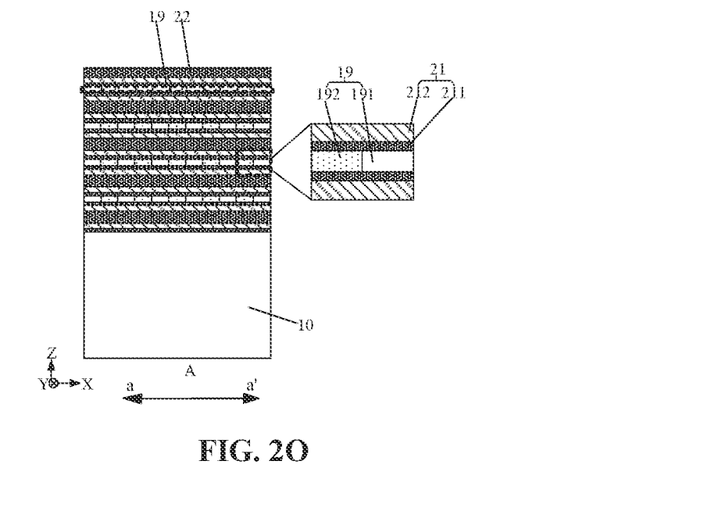
Figure 2P:
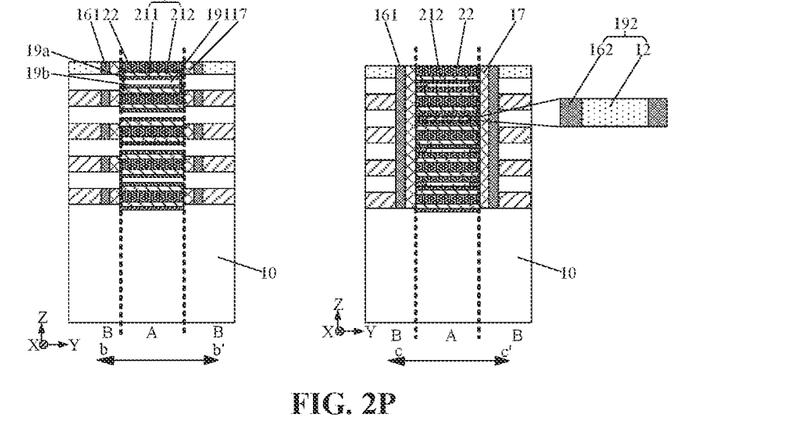

FIG. 2A to FIG. 2P illustrate schematic diagrams of a process for forming a semiconductor structure provided by the embodiments of the disclosure. The process for forming the semiconductor structure provided by the embodiments of the disclosure will be further described below in detail with reference to FIG. 2A to FIG. 2P. FIG. 2A and FIG. 2C are three-dimensional views. FIG. 2B, and FIG. 2D to FIG. 2P illustrate sectional views along a-a', b-b' and c-c' during forming the semiconductor structure.

First, S101 may be performed with reference to FIG. 2A to FIG. 2I. A base is provided. The base includes a first area and a second area located outside the first area. The first area includes stack structures and first isolation structures, where the stack structures and the first isolation structures are arranged alternately in a first direction. Each of the stack structures includes first semiconductor layers and second semiconductor layers, where the first semiconductor layers and the second semiconductor layers are stacked onto one another alternately in a third direction.

In some embodiments, the base may be formed by the following operations. A semiconductor substrate is provided. An initial stack structure is formed on the semiconductor substrate. The initial stack structure includes first semiconductor layers and second semiconductor layers, where the first semiconductor layers and the second semiconductor layers are stacked onto one another alternately from bottom to top in the third direction. The initial stack structure is patterned to form stack structures and an isolation trenches. First isolation structures are formed in the isolation trenches.

As shown in FIG. 2A and FIG. 2B, an initial stack structure 11a is formed on a surface of a semiconductor substrate 10. The initial stack structure 11a includes first semiconductor layers 111 and second semiconductor layers 112, where the first semiconductor layers and the second semiconductor layers are stacked onto one another alternately from bottom to top in a Z-axis direction.

In the embodiments of the disclosure, each of the first semiconductor layers 111 may be a silicon germanium layer, or may include other semiconductor elements. Each of the second semiconductor layers 112 may be a silicon layer, or may include other semiconductor elements.

In the embodiments of the disclosure, the number of the first semiconductor layers 111 and the number of the second semiconductor layers 112 in the initial stack structure 11a may be set according to the required storage density. The more the number of the first semiconductor layers 111 and the number of the second semiconductor layers 112, the higher the integration level of the semiconductor structure.

In the embodiments of the disclosure, the first semiconductor layers 111 and the second semiconductor layers 112 may be formed by any one of the following deposition processes: an epitaxy process, a chemical vapor deposition process, a physical vapor deposition process, an atomic layer deposition process, a spin coating process, a coating process, a thin film process and the like. For example, the first semiconductor layers 111 and the second semiconductor layers 112 may be formed successively on the semiconductor substrate 10 by the epitaxy process.

In some embodiments, as shown in FIG. 2C to FIG. 2E, the stack structures 11 and the isolation trenches 13 may be formed by the following operations. A mask layer 14 with a preset pattern is formed on a surface of the initial stack structure 11a. The preset pattern includes a plurality of sub-preset patterns F arranged along in an X-axis direction, and the sub-preset patterns F expose part of the initial stack structure 11a located in a first area A. The exposed part of the initial stack structure 11a is removed through the mask layer 14 to form the stack structures 11 and the isolation trenches 13.

In the embodiments of the disclosure, the material for the mask layer 14 may be one or more of silicon oxide, silicon nitride, silicon carbide, and silicon oxynitride.

In the embodiments of the disclosure, the exposed part of the initial stack structure 11a may be etched and removed by a High Aspect Ratio (HAR) technology, to form the stack structures 11 and the isolation trenches 13.

In the embodiments of the disclosure, after the stack structures 11 and the isolation trenches 13 are formed, the method for forming the semiconductor structure further includes the following operation. The mask layer 14 is removed to expose upper surfaces of the stack structures 11 (as shown in FIG. 2E).

In some embodiments, as shown in FIG. 2F, first isolation structures 12 may be formed by the following operation. A first isolation material is filled in the isolation trenches 13 to form first isolation structures 12. The first isolation material may be silicon oxide, silicon nitride, silicon oxynitride or other suitable materials.

It is to be noted that in a process of filling the first isolation material in the isolation trenches 13 to form the first isolation structures 12, part of the first isolation material is often deposited on surfaces of the stack structures 11. This part of the first isolation material located on the stack structures 11 forms an insulating layer 12a. The insulating layer 12a is at least configured to protect the second semiconductor layers 112 located on the top surfaces of the stack structures 11 from being damaged during subsequent processing of the stack structures 11.

In some embodiments, the base further includes support structures and sacrificial structures. The support structures and the sacrificial structures may be formed by the following operations. Part of the first semiconductor layers and part of the first isolation structures in the base are removed to form two etching grooves arranged in the second direction and extending in the first direction; and a support structure and a sacrificial structure located on both sides of the support structure in the second direction are formed in each of the etching grooves.

As shown in FIG. 2G, part of the first isolation structures 12 is removed and the first semiconductor layers 111 located in a projection area of the removed part of the first isolation structures 12 in the X-axis direction are removed to form two etching grooves 15 arranged in a Y-axis direction and extending in the X-axis direction and the Z-axis direction.

In the embodiments of the disclosure, the first isolation structures 12 and the first semiconductor layers 111 located in a projection area of the removed part of the first isolation structures 12 in the X-axis direction may be removed by a selective etching process.

It is to be noted that the etching grooves 15 are also formed in the insulating layer 12a located on the surfaces of the stack structures 11.

With reference to FIG. 2H, a sacrificial material is deposited on two side walls of each of the etching grooves 15 in the Y-axis direction to form a sacrificial structure 16. The sacrificial structure 16 includes a first sacrificial layer 161 and a second sacrificial layer 162. Then, a support material is filled in a void between the first sacrificial layer 161 and the second sacrificial layer 162, to form a support structure 17. In the embodiments of the disclosure, an area located between the support structures 17 in the Y-axis direction forms a first area A; and the other area located outside the first area A forms a second area B. The first sacrificial layer 161 is located in the second area B, and the second sacrificial layer 162 is located in the first area A.

In the embodiments of the disclosure, both the sacrificial structures 16 and the support structures 17 may be formed by any suitable deposition process. The sacrificial material may be a Spin On Hard Mask SOH material, a low-dielectric constant (Low K) material, or other suitable materials. The support material may be silicon nitride or silicon carbonitride.

In the embodiments of the disclosure, the support structures 17 may be configured to support subsequently formed gate structure or other functional structures, to improve the stability of the semiconductor structure.

In the embodiments of the disclosure, the base is divided into a first area and a second area through the support structures. The dimension of the first area in the second direction determines the dimension of a trench in the gate structure, so that the dimension of the trench in the gate structure can be adjusted by adjusting the position of the support structures, thereby adjusting the control capability of the gate structure, and improving the performance of the formed semiconductor structure.

In some embodiments, the etching selectivity ratio of the sacrificial structures 16 to the second semiconductor layers 112 is greater than the etching selectivity ratio of support structures 17 to the second semiconductor layers 112.

In the embodiments of the disclosure, the first sacrificial layer 161 in each of the sacrificial structures 16 may define the positions of a source and a drain, and the second sacrificial layer 162 in each of the sacrificial structures 16 may facilitate the subsequent removal of the second semiconductor layers in the stack structures. Therefore, during implementing, the second sacrificial layer 162 and the first sacrificial layer 161 need to be removed to realize a subsequent process. Thus, the etching selectivity ratio of the sacrificial structures 16 to the second semiconductor layers 112 needs to be set to be greater than the etching selectivity ratio of the support structures 17 to the second semiconductor layers 112. That is, the etching selectivity ratio of the second sacrificial layers 162 to the second semiconductor layers 112 is set to be greater than the etching selectivity ratio of the support structures 17 to the second semiconductor layers 112, and the etching selectivity ratio of the first sacrificial layers 161 to the second semiconductor layers 112 is set to be greater than the etching selectivity ratio of the support structures 17 to the second semiconductor layers 112, so that the second sacrificial layers 162 and the first sacrificial layers 161 are more easily etched and removed relative to the support structures 17 during etching.

In some embodiments, as shown in FIG. 2I, the method for forming the semiconductor structure further includes the following operation. The second sacrificial layers 162 located in the first area and located in the projection areas of the first semiconductor layers in the Y-axis direction and the insulating layer 12a located in the first area A are removed to form a plurality of first openings 18 arranged in the X-axis direction, the Y-axis direction, and the Z-axis direction. The plurality of first openings 18 can facilitate subsequent removal of the first semiconductor layers 111.

Then, S102 may be performed with reference to FIG. 2J to FIG. 2N. The first semiconductor layers located in the first area and the first isolation structures located in the first area and located in the projection areas of the first semiconductor layers in the first direction are removed successively, to from active dummy connection layers extending in the first direction.

As shown in FIG. 2J, the first semiconductor layers 111 located in the first area A are removed through the plurality of first openings 18.

In some embodiments, as shown in FIG. 2K and FIG. 2L, after the first semiconductor layers 111 located in the first area A are removed, the method for forming the semiconductor structure further includes the following operation. The second semiconductor layers 112 located in the first area A are thinned to form thinned second semiconductor layers 112 and first spaces 20, where the thinned second semiconductor layers 112 form active layers 191.

In the embodiments of the disclosure, with continuous reference to FIG. 2K and FIG. 2L, the second semiconductor layers 112 are thinned by the following operations. The second semiconductor layers 112 are oxidized in situ, to oxidize part of each of the second semiconductor layers 112 into third sacrificial layers 193, and the third sacrificial layers 193 are removed by a wet etching technology or a dry etching technology. The first spaces 20 are formed after the third sacrificial layers 193 are removed.

In the embodiments of the disclosure, the thickness of each of the third sacrificial layers 193 may be 0.2 to 0.8 times, for example, 0.5 times, the thickness of each of the second semiconductor layers 112.

In the embodiments of the disclosure, the formed active layers may be cylindrical by thinning, that is, a section of each of the active layers in the third direction is closer to a circle, so that the electric leakage of the semiconductor structure can be reduced.

Then, with continuous reference to FIG. 2L, after the first isolation structures 12 located in the projection areas of the first spaces 20 and the first semiconductor layers 111 in the X-axis direction and the second sacrificial layers 162 located in the projection areas of the first spaces 20 and the plurality of first openings 18 in the X-axis direction are removed simultaneously, remaining parts of the second sacrificial layers 162 and remaining parts of the first isolation structures 12 together form the dummy connection layers 192. That is, the first isolation structures 12 and the second sacrificial layers 162 located in the projection areas of the active layers 191 in the X-axis direction together form the dummy connection layers 192.

In the embodiments of the disclosure, the first isolation structures 12 located in the projection areas of the first spaces 20 and the first semiconductor layers 111 in the X-axis direction and the second sacrificial layers 162 located in the projection areas of the first spaces 20 and the plurality of first openings 18 in the X-axis direction may be laterally etched and removed by a self-aligned process.

In the embodiments of the disclosure, the active layers 191 and the dummy connection layers 192 form active dummy connection layers 19. With continuous reference to FIG. 2L, each of the active dummy connection layers 19 is provided with a first surface 19a and a second surface 19b in the Z-axis direction.

In other embodiments, as shown in FIG. 2M and FIG. 2N, after the first semiconductor layers 111 located in the first area A, the first isolation structures located in the first area A and located in projection areas of the first semiconductor layers 111 in the X-axis direction, and the second sacrificial layers 162 located in the projection areas of the plurality of first openings in the X-axis direction are removed simultaneously, the remaining parts of the second semiconductor layers 112 form the active layers 191, and the remaining parts of the first isolation structures 12 and the remaining parts of the second sacrificial layers 162 together form the dummy connection layers 192, and the active layers 191 and the dummy connection layers 192 form the active dummy connection layers 19. After the active dummy connection layers 19 are formed, the method for forming the semiconductor structure further includes the following operation. The active dummy connection layers 19 are thinned directly. For example, the active dummy connection layers 19 are directly etched by dry etching until the required thickness is formed, and then the etching is stopped.

In the embodiments of the disclosure, the formed active dummy connection layers may be cylindrical by thinning, that is, a section of each of the active dummy connection layers in the third direction is closer to a circle, so that the electric leakage of the semiconductor structure can be reduced. In addition, a void between any active layers adjacent to each other in the third direction may become larger by thinning, which facilitates subsequent formation of the gate structures better, thereby reducing the process complexity of the gate structures and reducing the manufacturing cost of the semiconductor structure.

It is to be noted that in other embodiments, the second semiconductor layer 112 may also not be thinned. After the first semiconductor layers 111 located in the first area A, the first isolation layers located in the first area A and located in projection areas of the first semiconductor layers 111 in the X-axis direction, and the second sacrificial layers 162 located in the projection areas of the first plurality of openings in the X-axis direction are removed simultaneously, the remaining parts of the second semiconductor layers form the active layers 191, and the remaining parts of the first isolation structures 12 and the remaining parts of the second sacrificial layers 162 together form the dummy connection layers 192 (as shown in FIG. 2M).

Finally, S103 may be performed with reference to FIG. 2O and FIG. 2P. Gate structures are formed on surfaces of the active dummy connection layers.

In some embodiments, the gate structures are formed by the following operation. A gate dielectric layer and a gate conductive layer located on a surface of the gate dielectric layer are successively formed on each of the first surface and the second surface of each of the active dummy connection layers in the third direction.

In combination with FIG. 2L, FIG. 2O, and FIG. 2P, a gate dielectric material and a gate conductive material are successively deposited on each of the first surface 19a and the second surface 19b of each of the active dummy connection layers 19 in the Y-axis direction to form a gate dielectric layer 211 and a gate conductive layer 212. Each of the gate structures 21 includes the gate dielectric layer 211 and the gate conductive layer 212 located on the surface of the gate dielectric layer 211.

In the embodiments of the disclosure, the gate dielectric material may be silicon oxide or other suitable materials. The gate conductive material may be any one of the materials with good electrical conductivity, such as titanium (Ti), titanium nitride (TiN), tungsten (W), cobalt (Co), platinum (Pt), palladium (Pd), ruthenium (Ru), and Copper (Cu) or a combination thereof.

In the embodiments of the disclosure, the gate dielectric layer 211 and the gate conductive layer 212 may be formed by any suitable deposition process, such as the CVD process, the PVD process, and the ALD process.

In the embodiments of the disclosure, the gate structures 21 may be dual gate structures. The gate conductive layer 212 located on a surface of each of the dummy connection layers 192 may serve as a word line to connect two adjacent gate structures located in the same layer with each other.

In the embodiments of the disclosure, the gate conductive layer is formed on a surface of each of the active dummy connection layers. The gate conductive layer located on the surface of each of the dummy connection layers may serve as a word line to realize the connection between two adjacent gate structures located in the same layer.

In some embodiments, with continuous reference to FIG. 2O and FIG. 2P, after the gate structures 21 are formed, the method for forming the semiconductor structure further includes the following operation. Second isolation structures 22 are formed in voids between the gate conductive layers 212.

In the embodiments of the disclosure, a second isolation material is filled in the voids between the gate conductive layers 212 to form the second isolation structures 22. The second isolation material and the first isolation material may be the same, or may be different from each other.

In the embodiments of the disclosure, the second isolation structures are configured to isolate any two gate structures, which are adjacent to each other in the third direction, from one another, to reduce leakage current, thereby improving the yield of semiconductor structures.

In the embodiments of the disclosure, after the second isolation structures are formed, the method for forming the semiconductor structure further includes the following operations. The first sacrificial layers 161 are removed to form second openings (not shown), and ion implantation is performed on the active layers 191 through the second openings to form a source and a drain.

In the embodiments of the disclosure, a dummy connection layer for connecting two active layers with each other in a first direction is formed during forming a semiconductor structure. The dummy connection layer facilitates subsequent formation of a gate metal layer for connecting gate structures in the same layer with each other. In addition, the dummy connection layer can serve as an electron barrier layer to isolate any two gate structures, which are adjacent to each other in the first direction, from one another, which reduces leakage current, thereby improving the yield of the prepared semiconductor structures. In the embodiments of the disclosure, the formed semiconductor structure includes horizontal gate structures, and the gate structures are stacked onto one another in the third direction. A stack structure formed by stacking a plurality of gate structures onto one another in the third direction may form a three-dimensional semiconductor structure, so that the integration level of the semiconductor structure can be improved and miniaturization can be realized.

Figure 3A:
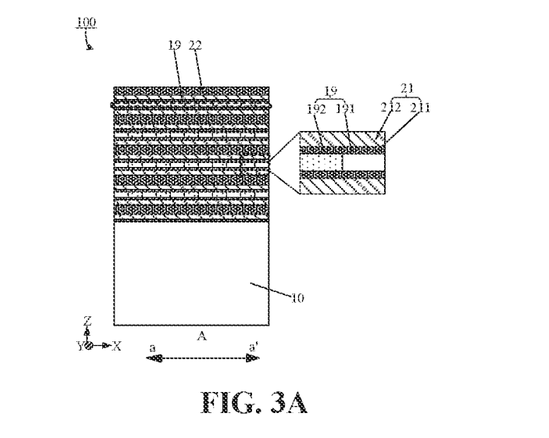
FIG. 3A and FIG. 3B illustrate schematic diagrams of a semiconductor structure provided by the embodiments of the disclosure.
Figure 3B:
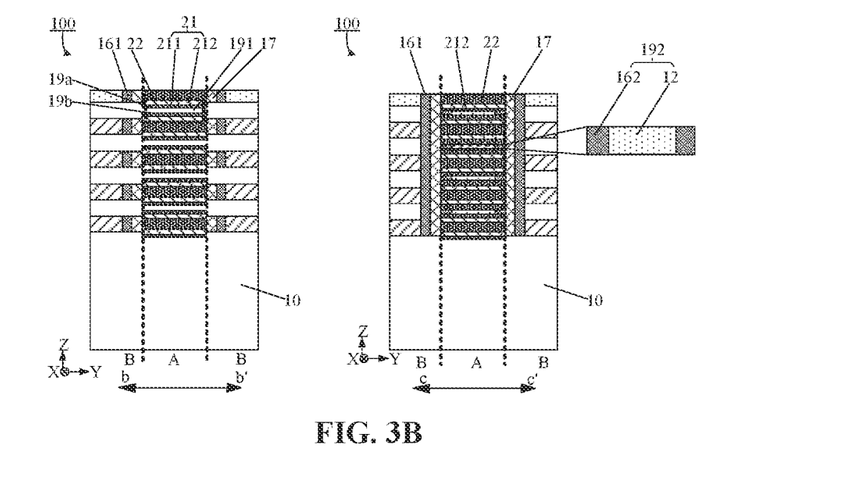

In addition, the embodiments of the disclosure further provide a semiconductor structure. FIG. 3A and FIG. 3B illustrate schematic diagrams of a semiconductor structure provided by the embodiments of the disclosure. As shown in FIG. 3A and FIG. 3B, the semiconductor structure 100 at least includes: a semiconductor substrate 10, the semiconductor substrate 10 including a first area A and a second area B located outside the first area A; active dummy connection layers 19 extending in an X-axis direction, the active dummy connection layers 19 being located in the first area A and being spaced apart from each other in a Z-axis direction; and gate structures 21 located on surfaces of the active dummy connection layers 19.

In some embodiments, with continuous reference to FIG. 3A and FIG. 3B, each of the active dummy connection layers 19 includes active layers 191 and dummy connection layers 192, where the active layers 191 and the dummy connection layers 192 are arranged alternately in the X-axis direction. Each of the dummy connection layers 192 includes an isolation structure 12 and second sacrificial layers 162 located on both sides of the isolation structure 12 in the second direction. The isolation structure 12 and the second sacrificial layers 162 are located in projection areas of the active layers 191 in the X-axis direction.

In some embodiments, with continuous reference to FIG. 3B, the semiconductor structure 100 further includes support structures 17. The support structures 17 are spaced apart from each other in the Y-axis direction and extend in the X-axis direction and the Z-axis direction. An area between two support structures 17 arranged in the Y-axis direction forms a first area A.

In some embodiments, with continuous reference to FIG. 3B, the semiconductor structure 100 further includes first sacrificial layers 161. The first sacrificial layers 161 are spaced apart from each other in the Y-axis direction and extend in the X-axis direction and the Z-axis direction. The first sacrificial layers 161 are located in the second area B, and each of the first sacrificial layers 161 located on one side of a respective one of the support structures 17 in the Y-axis direction.

In some embodiments, with continuous reference to FIG. 3A and FIG. 3B, the gate structures 21 cover first surfaces 19a and second surfaces 19b of the active dummy connection layers 19 in the Z-axis direction. Each of the gate structures 21 includes a gate dielectric layer 211 and a gate conductive layer 212 located on a surface of the gate dielectric layer 211. The gate conductive layer 212 located on the surface of each of the dummy connection layers 192 may serve as a word line.

In some embodiments, with continuous reference to FIG. 3A and FIG. 3B, the semiconductor structure 100 further includes second isolation structure 22 located between the gate conductive layers 212.

The semiconductor structure provided by the embodiments of the disclosure is similar to the method for forming the semiconductor structure provided by the abovementioned embodiments. The technical features not disclosed in detail in the embodiments of the disclosure refer to the abovementioned embodiments for understanding, and will not be elaborated herein.

The semiconductor structure provided by the embodiments of the disclosure at least includes dummy connection layers. On one hand, the dummy connection layers can connect two active layers arranged in the first direction with each other, to facilitate subsequent formation of a gate metal layer for connecting the gate structures in the same layer with each other; and on the other hand, the dummy connection layers can serve as electron barrier layers to isolate any two gate structures, which are adjacent to each other in the first direction, from one another, which reduces leakage current, thereby improving the yield of the prepared semiconductor structures. In addition, gate structures in the embodiments of the disclosure are horizontal, and a stack structure formed by stacking a plurality of horizontal gate structures onto one another in the third direction may form a three-dimensional semiconductor structure, so that the integration level of the semiconductor structure can be improved and miniaturization can be realized.

In the embodiments of the disclosure, a dummy connection layer for connecting two active layers in a first direction with each other is formed during forming a semiconductor structure. The dummy connection layer can facilitate subsequent formation of a gate metal layer for connecting gate structures located in the same layer with each other, which simplifies a process of the gate structures, and reduces the preparation cost of the semiconductor structure. In addition, the dummy connection layer can also serve as an electronic barrier layer to isolate adjacent gate structures located in the same layer from each other, which reduces leakage current, thereby improving the yield of the prepared semiconductor structures.

In several embodiments provided by the disclosure, it is to be understood that the disclosed device and method may be implemented in a non-target mode. The above described device embodiments are only schematic. For example, the division of the units is only logical function division. In actual implementation, there may be other division modes, for example, a plurality of units or components may be combined, or may be integrated into another system, or some features may be ignored or not implemented. In addition, the components shown or discussed are coupled to each other, or directly coupled.

The characteristics disclosed in several method or device embodiments provided in the disclosure may be freely combined without conflicts to obtain new method embodiments or device embodiments.

The abovementioned descriptions are only some implementation modes of the disclosure, but the scope of protection of the disclosure is not limited thereto. Any variation or replacement readily figured out by a person skilled in the art within the technical scope disclosed in the disclosure shall fall within the scope of the protection of the disclosure. Therefore, the scope of the protection of the disclosure shall be subject to the scope of protection of the claims.

The invention claimed is:

1. A method for forming a semiconductor structure, comprising:
providing a base, the base comprising a first area and a second area located outside the first area, the first area comprising stack structures and first isolation structures, the stack structures and the first isolation structures being arranged alternately in a first direction, each of the stack structures comprising first semiconductor layers and second semiconductor layers, the first semiconductor layers and the second semiconductor layers being stacked onto one another alternately in a third direction, the first direction being a direction in a plane where the base is located, the third direction intersecting with the plane where the base is located;
successively removing the first semiconductor layers located in the first area, and the first isolation structures located in the first area and located in projection areas of the first semiconductor layers in the first direction, to form active dummy connection layers extending in the first direction; and
forming gate structures on surfaces of the active dummy connection layers;
wherein before removing the first semiconductor layers located in the first area, the method further comprises:
removing part of the first semiconductor layers and part of the first isolation structures in the base to form two etching grooves arranged in a second direction and extending in the first direction and the third direction, wherein the second direction and the first direction are located in the same plane; and
forming a support structure and a sacrificial structure located on both sides of the support structure in the second direction in each of the two etching grooves, wherein an area located between the support structures form the first area.

2. The method for forming the semiconductor structure of claim 1, wherein each of the active dummy connection layers comprises active layers and dummy connection layers, and the active layers and the dummy connection layers are arranged alternately in the first direction;
wherein forming the active layers and the dummy connection layers comprises:
successively removing the first semiconductor layers located in the first area and part of the first isolation structures located in the first area, wherein remaining parts of the second semiconductor layers form the active layers, and remaining parts of the first isolation structures form the dummy connection layers.

3. The method for forming the semiconductor structure of claim 2, wherein after removing the first semiconductor layers located in the first area and before removing the first isolation structures located in the first area, the method further comprises:

thinning the second semiconductor layers located in the first area to form first spaces and thinned second semiconductor layers, wherein the thinned second semiconductor layers form the active layers.

4. The method for forming the semiconductor structure of claim 3, further comprising:

removing the first isolation structures located in projection areas of the first spaces in the first direction when the first isolation structures located in the projection areas of the first semiconductor layers in the first direction are removed, wherein the remaining parts of the first isolation structures form the dummy connection layers.

5. The method for forming the semiconductor structure of claim 2, after forming the active dummy connection layers and before forming the gate structures, further comprising:

thinning the active dummy connection layers.

6. The method for forming the semiconductor structure of claim 1, wherein the sacrificial structure comprises a first sacrificial layer located in the first area and a second sacrificial layer located in the second area.

7. The method for forming the semiconductor structure of claim 6, wherein an etching selectivity ratio of the sacrificial structure to the second semiconductor layers is greater than an etching selectivity ratio of the support structures to the second semiconductor layers.

8. The method for forming the semiconductor structure of claim 7, wherein before removing the first semiconductor layers, the method further comprises:

removing the second sacrificial layers located in the first area and located in projection areas of the first semiconductor layers in the second direction to form a plurality of first openings.

9. The method for forming the semiconductor structure of claim 8, wherein forming the gate structures comprises:

successively forming a gate dielectric layer and a gate conductive layer located on a surface of the gate dielectric layer on each of a first surface and a second surface of each of the active dummy connection layers in the third direction.

10. The method for forming the semiconductor structure of claim 9, wherein after forming the gate structures, the method further comprises:

forming second isolation structures in voids between the gate conductive layers.

11. The method for forming the semiconductor structure of claim 6, wherein forming the base comprises:

providing a semiconductor substrate;

forming an initial stack structure on the semiconductor substrate, wherein the initial stack structure comprises the first semiconductor layers and the second semiconductor layers stacked onto one another alternately from bottom to top in the third direction;

patterning the initial stack structure to form the stack structures and isolation trenches; and forming the first isolation structures in the isolation trenches.

12. A semiconductor structure, at least comprising:

a semiconductor substrate, the semiconductor substrate comprising a first area and a second area located outside the first area;

active dummy connection layers extending in a first direction, the active dummy connection layers being located in the first area of the semiconductor substrate and being spaced apart from each other in a third direction, the first direction being a direction in a plane where the semiconductor substrate is located, and the third direction intersecting with the plane where the semiconductor substrate is located; and gate structures located on surfaces of the active dummy connection layers;

wherein each of the active dummy connection layers comprises active layers and dummy connection layers, and the active layers and the dummy connection layers are arranged alternately in the first direction;

wherein the semiconductor structure further comprises: support structures and first sacrificial layers;

the support structures are spaced apart from each other in a second direction and extend in the first direction and the third direction, wherein an area between the two support structures arranged in the second direction forms the first area, and the second direction and the first direction are located in the same plane;

the first sacrificial structures are spaced apart from each other in the second direction and extend in the first direction and the third direction, wherein the first sacrificial layers are located in the second area and each of the first sacrificial layers is located on a side wall of a respective one of the support structures.

13. The semiconductor structure of claim 12, wherein the gate structures cover first surfaces and second surfaces of the active dummy connection layers in the third direction; and each of the gate structures comprises a gate dielectric layer and a gate conductive layer located on a surface of the gate dielectric layer.

14. The semiconductor structure of claim 13, further comprising: second isolation structures located between the gate conductive layers.

* * * * *